United States Patent
En et al.

(10) Patent No.: US 6,812,550 B1
(45) Date of Patent: Nov. 2, 2004

(54) WAFER PATTERN VARIATION OF INTEGRATED CIRCUIT FABRICATION

(75) Inventors: William George En, Milpitas, CA (US); Eric Paton, Morgan Hill, CA (US); Mario M. Pelella, Mountain View, CA (US); Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/700,733

(22) Filed: Nov. 3, 2003

(51) Int. Cl.[7] .......................... H01L 23/58; H01L 21/44; H01L 21/48; H01L 21/50

(52) U.S. Cl. ....................... 257/629; 257/633; 438/107; 438/113; 438/122

(58) Field of Search ............................... 257/629, 633, 257/618; 438/33, 107, 110, 113, 122

(56) References Cited

U.S. PATENT DOCUMENTS

| | | | |
|---|---|---|---|
| 5,699,260 A | * 12/1997 | Lucas et al. ................. | 700/121 |
| 5,960,305 A | * 9/1999 | Kumar ....................... | 438/598 |
| 6,259,115 B1 | 7/2001 | You et al. | |
| 6,268,656 B1 | * 7/2001 | Leibovitz et al. ........... | 257/737 |
| 6,461,941 B2 | * 10/2002 | Kim .......................... | 438/462 |
| 6,756,796 B2 | * 6/2004 | Subramanian .............. | 324/750 |
| 2004/0012404 A1 | * 1/2004 | Feder et al. ................. | 324/760 |

* cited by examiner

*Primary Examiner*—Nathan J. Flynn
*Assistant Examiner*—Victor A. Mandala, Jr.
(74) *Attorney, Agent, or Firm*—Mikio Ishimaru

(57) ABSTRACT

A method for manufacturing an integrated circuit on a semiconductor wafer is provided. The semiconductor wafer has complete die and partial die areas thereon. Functional circuit patterns are formed in a plurality of the complete die areas. The thermal absorption properties of the semiconductor wafer are tuned by forming differing patterns in a plurality of the partial die areas.

20 Claims, 5 Drawing Sheets

WAFER PATTERN VARIATION OF INTEGRATED CIRCUIT FABRICATION

BACKGROUND

TECHNICAL FIELD

The present invention relates generally to semiconductor manufacturing technology, and more specifically to wafer temperature control in semiconductor fabrication processes.

BACKGROUND ART

At the present time, electronic products are used in almost every aspect of life, and the heart of these electronic products is the integrated circuit. Integrated circuits are made in and on silicon wafers by extremely complex systems that require the coordination of hundreds or even thousands of precisely controlled processes to produce a finished semiconductor wafer. Each finished semiconductor wafer contains hundreds to tens of thousands of integrated circuits.

Integrated circuits are made up of hundreds to millions of individual components, such as the semiconductor transistor. The most common and important semiconductor technology presently used is silicon-based, and the most preferred silicon-based semiconductor device is a Complementary Metal Oxide Semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. These lightly doped regions of the silicon substrate are referred to as "shallow source/drain junctions", which are separated by a channel region beneath the polysilicon gate. A curved silicon oxide or silicon nitride spacer, referred to as a "sidewall spacer", on the sides of the polysilicon gate, allows deposition of additional doping to form more heavily doped regions of the shallow source/drain junctions, called "deep source/drain junctions". The shallow and deep source/drain junctions are collectively referred to as "S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels or layers of interlayer dielectric ("ILD") material to the outside of the ILD.

These fabrication procedures include a number of thermal processes. The gate oxide layer is thermally grown on the silicon substrate of the semiconductor wafer. The gate oxides and polysilicon gates are also used as masks to form the shallow source/drain regions by ion implantation of boron or phosphorus impurity atoms into the surface of the silicon substrate. The ion implantation is then followed by a high-temperature anneal above 700° C. to activate the implanted impurity atoms to form the shallow source/drain junctions.

A silicon nitride layer is then deposited and etched to form sidewall spacers around the side surfaces of the gate oxides and polysilicon gates. The sidewall spacers, the gate oxides, and the polysilicon gates are used as masks for forming conventional source/drain regions by ion implantation into the surface of the silicon substrate into and through the shallow source/drain junctions. This ion implantation is again followed by a high-temperature anneal above 700° C. to activate the implanted impurity atoms to form the S/D junctions.

As transistors have decreased in size, it has been found that the electrical resistance between the metal contacts and the silicon substrate or the polysilicon has increased to the point that it negatively impacts the performance of the transistors. To lower that electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by applying a thin layer of the cobalt or titanium on the silicon substrate above the S/D junctions and the polysilicon gates. The semiconductor wafer hen receives one or more annealing steps at temperatures above 800° C. This causes the cobalt or titanium to selectively react with the silicon and the polysilicon to form the metal silicide.

After the individual devices, such as the transistors, have been fabricated in the silicon substrate, they must be connected together to perform the desired circuit functions. This connection process is generally called "metalization", and is performed using a number of different photolithographic and deposition techniques.

One metalization process is called the "damascene" technique, and for multiple layers of channels there is a metalization process called the "dual damascene" technique. These techniques utilize various damascene adhesion, barrier, seed, and conductive materials deposition processes that each require uniform heating of the silicon substrate, usually to high-temperatures.

Such high-temperature deposition and annealing steps present considerable challenges for the fabrication of multiple "dies" or "chips" (regions containing entire integrated circuits) on a single, large semiconductor wafer. During each high-temperature step, temperatures for every die must be the same at every location on the wafer, from edge-to-center-to-edge. Such cross-wafer temperature control is increasingly critical with advances in high-speed semiconductor fabrication processes and the continuing reduction of circuit element dimensions.

Wafer heating uniformity is thus necessary in a great many device fabrication techniques. For example, metal deposition techniques such as physical vapor deposition ("PVD") or chemical vapor deposition ("CVD") require a relatively uniform wafer temperature in order to achieve uniform deposition with good adhesion. Still other device fabrication techniques that require uniformity of wafer heating include rapid thermal anneal ("RTA"), temperature gradient zone melting ("TGZM"), lateral epitaxial growth-on-oxide ("LEGO"), and high-temperature recrystallization ("HTR").

Wafer heating is typically accomplished by placing the wafer on the ends of a number of pins that project from the floor of an oven. A bank of heat lamps is mounted in the upper portion of the oven for heating one of the major surfaces of the wafer. The opposite major wafer surface is exposed to the floor of the oven, which is often cooled by cooling coils or the like. In this arrangement, the opposing major surface of the wafer can be kept cooler than the surface exposed to the heat lamps. This can establish a temperature gradient through the wafer, which is very desirable in achieving TGZM, LEGO and HTR.

However, when the heating is non-uniform across (rather than through) the wafer ("non-uniform lateral heating") difficulties during wafer processing can occur. For example, during heating of the wafer to accomplish TGZM, temperature variations across the wafer can lead to distortion of the migration pattern of a dopant. Uneven heating during a LEGO process can result in non-uniform melting across the wafer. Lateral temperature variations across the wafer can also result in substantial stresses on the wafer that cause non-elastic deformation ("slip") of the wafer lattice. Wafer warpage is also caused by such non-uniform lateral heating.

One solution for achieving more uniform wafer heating is to include "dummy" tiles in portions of the wafer where circuits are not being formed. For example, semiconductor dies are usually rectangular but the wafers on which the dies are formed are round. This creates odd-shaped areas at the edge or periphery of the wafer that are too small to be made into a semiconductor die. However, to keep wafer temperatures more uniform, partial die patterns can be fabricated in those areas. Of course, the partial dies are not functional or usable, but they absorb and radiate heat the same as the rest of the wafer to help achieve more uniform edge-to-edge wafer temperatures during manufacturing.

Nevertheless, a need still remains for achieving even better control of temperature variations throughout the wafer during these heating processes. For example, heating oven configurations must be able to accommodate wafers with many different circuit layouts and designs. Each such design has its own unique variations, and thus suffers from its own temperature differences independently of the oven design. Further, as the industry moves to smaller and smaller device sizes, the individual circuit elements on the wafers become increasingly sensitive to such process temperature variations. It is thus becoming even more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit on a semiconductor wafer having complete die and partial die areas thereon. Functional circuit patterns are formed in a plurality of the complete die areas. Forming differing patterns in a plurality of the partial die areas then allows for tuning the thermal absorption properties of the semiconductor wafer. This method provides a wafer that is less sensitive to oven variations, requires less process tuning, and exhibits reduced wafer warpage.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
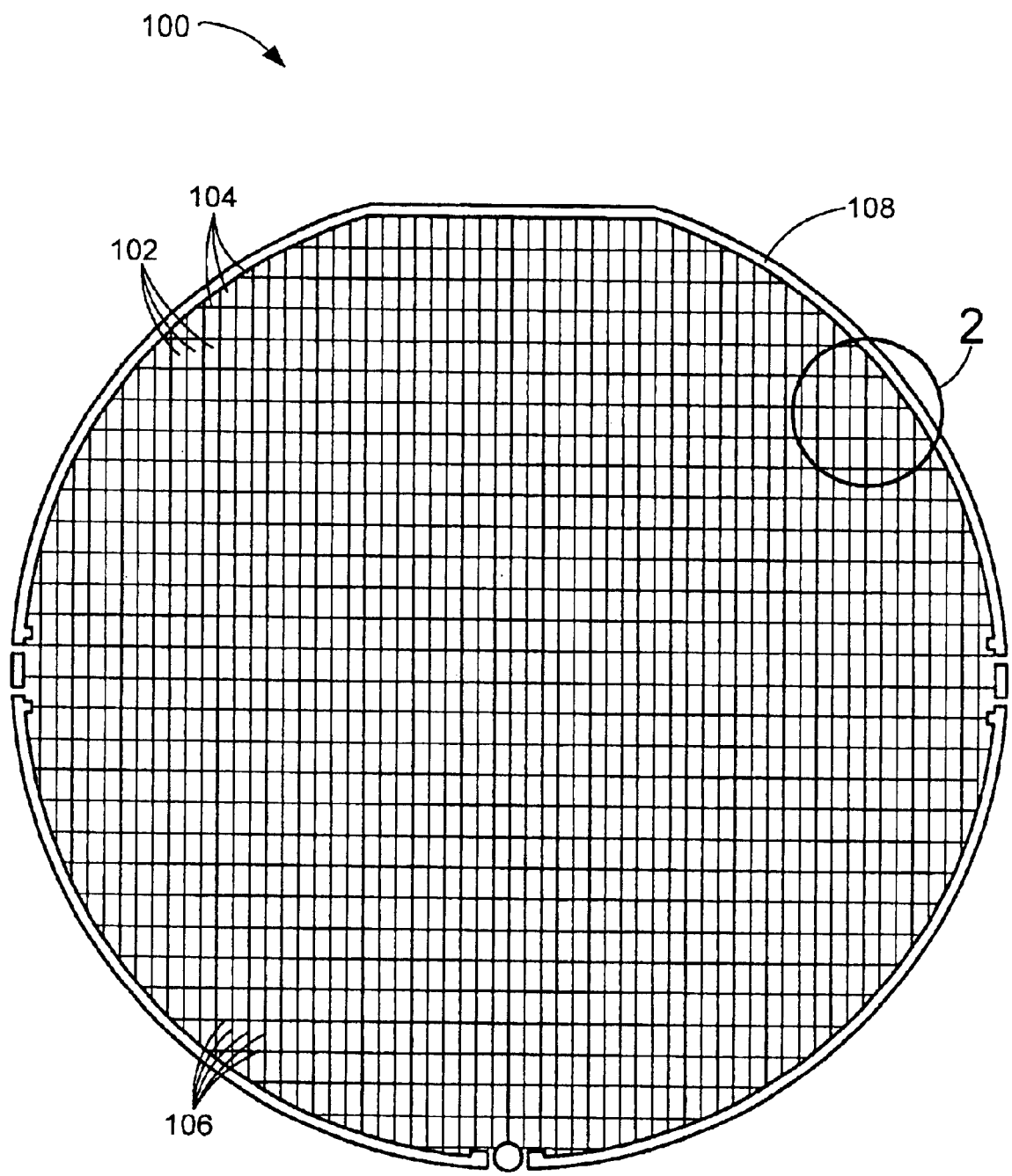
FIG. 1 is a view of a wafer in an intermediate stage of manufacturing in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

In semiconductor manufacturing, single-wafer processing using rapid wafer heating is a powerful and versatile technique for fabrication of very-large-scale integrated ("VLSI") and ultra-large-scale integrated ("ULSI") electronic devices. Such processes allow both the wafer temperature and the process environment to be quickly changed, permitting each fabrication step and its sub-processes to be independently optimized in order to improve the overall electrical performance of the fabricated devices.

Rapid thermal processing ("RTP") of semiconductor wafers provides a capability for better wafer-to-wafer process repeatability in a single-wafer lamp-heated thermal processing reactor. Numerous silicon fabrication technologies can use RTP techniques, including thermal oxidation, nitridation, dopant diffusion, and different types of thermal anneals. Refractory metal silicide formation and chemical-vapor deposition ("CVD") are other significant silicon device fabrication processes that can benefit from RTP in a single-wafer reactor. For example, CVD processes to form dielectrics (e.g., oxides and nitrides) and semiconductive materials such as amorphous silicon and polysilicon, as well as conductors (e.g., aluminum, copper, tungsten, and titanium nitride), can be performed using advanced RTP techniques for VLSI and ULSI device fabrication.

RTP offers an extended process parameter space that is different from that of the conventional batch furnace processing techniques. In contrast to furnace processing, RTP is used primarily for short time (e.g., 1–300 seconds) controlled wafer processing over an extended range of wafer temperatures. The current generation of commercial lamp-heated RTP tools has been introduced mainly for high-temperature wafer annealing and thin dielectric growth applications. However, the single-wafer RTP reactors are now evolving toward advanced systems that can be used in applications such as epitaxial growth, CVD of tungsten, CVD of polysilicon and dielectrics, and in-situ multiprocessing. RTP operates based on the single-wafer processing methodology that is considered desirable for flexible fast turn-around integrated circuit manufacturing.

A large number of non-thermal processes (such as ion implantation, microlithography, plasma etching, etc.) in an integrated circuit fabrication sequence are now done in the single-wafer mode. However, most of the thermal fabrication steps (e.g., epitaxy, CVD, diffusion, oxidation, etc.) are still performed in conventional batch furnaces, mainly due to throughput requirements and manufacturing and process control problems associated with the commercial RTP techniques.

In the conventional RTP systems, equipment manufacturers have spent significant design resources to insure that the illuminator designs provide uniform wafer heating during steady-state conditions. These systems are designed with illuminators that provide single-zone or very limited multi-zone control capability. Thus, with an increase or decrease of the power to the illuminator, the entire wafer temperature distribution is affected. As a result, there are insufficient real-time control capabilities to adjust or optimize lateral wafer temperature uniformity during the steady-state and dynamic transient heat-up and cool-down cycles. Although known systems can provide some degree of lateral wafer temperature uniformity under steady-state conditions, those systems provide even less lateral wafer temperature uniformity during transient heat-up and cool-down periods.

As a result, the transient heat-up or cool-down process segments can result in formation of slip dislocations (at high temperatures, e.g., 850° C.) as well as process non-uniformities and wafer warpage. Moreover, known RTP systems do not provide a sufficient capability to adjust or optimize wafer temperature uniformity during the transient conditions over extended temperature ranges. Various process parameters can influence and degrade the RTP uniformity. For example, known RTP systems might be optimized to provide steady-state temperature uniformity at a fixed pressure such as atmospheric process pressure. However, a change in process pressure as well as gas flow rates can then degrade the RTP uniformity.

The continuing down-scaling of device dimensions in VLSI/ULSI circuits places increasingly challenging demands on the manufacturing tools and technologies required to manufacture complex microelectronics chips. Rapid technological advancements have reduced the minimum feature sizes of the digital integrated circuits ("IC's") well into the sub-micron regime. As a result, short-time and/or activated high-temperature processes are considered to be essential for minimizing dopant redistribution problems, increasing chip fabrication yield, and achieving enhanced process reproducibility and control during the device fabrication sequence.

In an attempt to attain uniform lateral heating, known ovens may be provided with a diffuser situated between the wafer and the bank of lamps to distribute the heat uniformly across the wafer. Further, reflectors may be provided on the oven floor to reflect heat back toward the wafer. However, even with these aids, uneven heating of the wafer can occur for several reasons. Heat is lost from the wafer both by radiation and by convection, and is lost more quickly from the edges than from the center. Heat is absorbed from the heat lamps unevenly as well, due in part to differences in circuit patterns on the wafer surface, with some patterns absorbing heat more readily from the heat lamps than other patterns or non-patterned areas. For example, silicon ("Si") and silicon oxide ("$SiO_2$") have significantly different heat absorption properties.

To overcome these limitations, previous techniques recognized that patterning only the complete dies on the wafer caused severe wafer warpage due to pattern loading effects. The pattern loading effects resulted from the different heat absorption properties of the unpatterned partial die areas at the wafer periphery compared with the heat absorption properties of the complete dies located elsewhere on the wafer. This caused significant temperature differences on the wafer periphery compared with the remainder of the wafer. In response, the partial dies on the wafer were patterned with the same (albeit partial) patterns of the complete dies. This beneficially reduced the pattern loading effect and correspondingly reduced wafer warpage. However, the problem of cross-wafer temperature variation was not always eliminated.

Referring now to FIG. 1, therein is shown a wafer 100 in an intermediate stage of manufacturing. Large numbers of complete dies 102, each having identical functional circuit patterns thereon, are located on the surface of the wafer 100. In order to present uniform heat absorption characteristics across the entire surface of the wafer 100 as described previously, the partial dies 104 that are located along the edge or periphery of the wafer 100 have the same (but only partial) circuit patterns as well, and these are formed simultaneously with the manufacturing of the complete dies 102. Of course, the circuit patterns on the partial dies 104 are themselves only partial, and are therefore non-functional. Therefore, as used herein "partial die" and "partial die area" refer to those portions of the wafer on which complete, functional dies are not fabricated. Thus, a partial die may actually encompass an area considerably larger than a complete die, may lack conventional scribe lines, and may in fact be devoid of any patterning whatsoever.

In the one embodiment shown in FIG. 1, each of the complete dies 102 and the partial dies 104 is slightly separated from its neighboring dies by conventional scribe lines 106 to provide for individually separating the dies from the wafer 100 upon completion of the wafer manufacturing process. The edge of the wafer 100 along the periphery thereof is defined by a wafer edge area 108.

Figure 2:
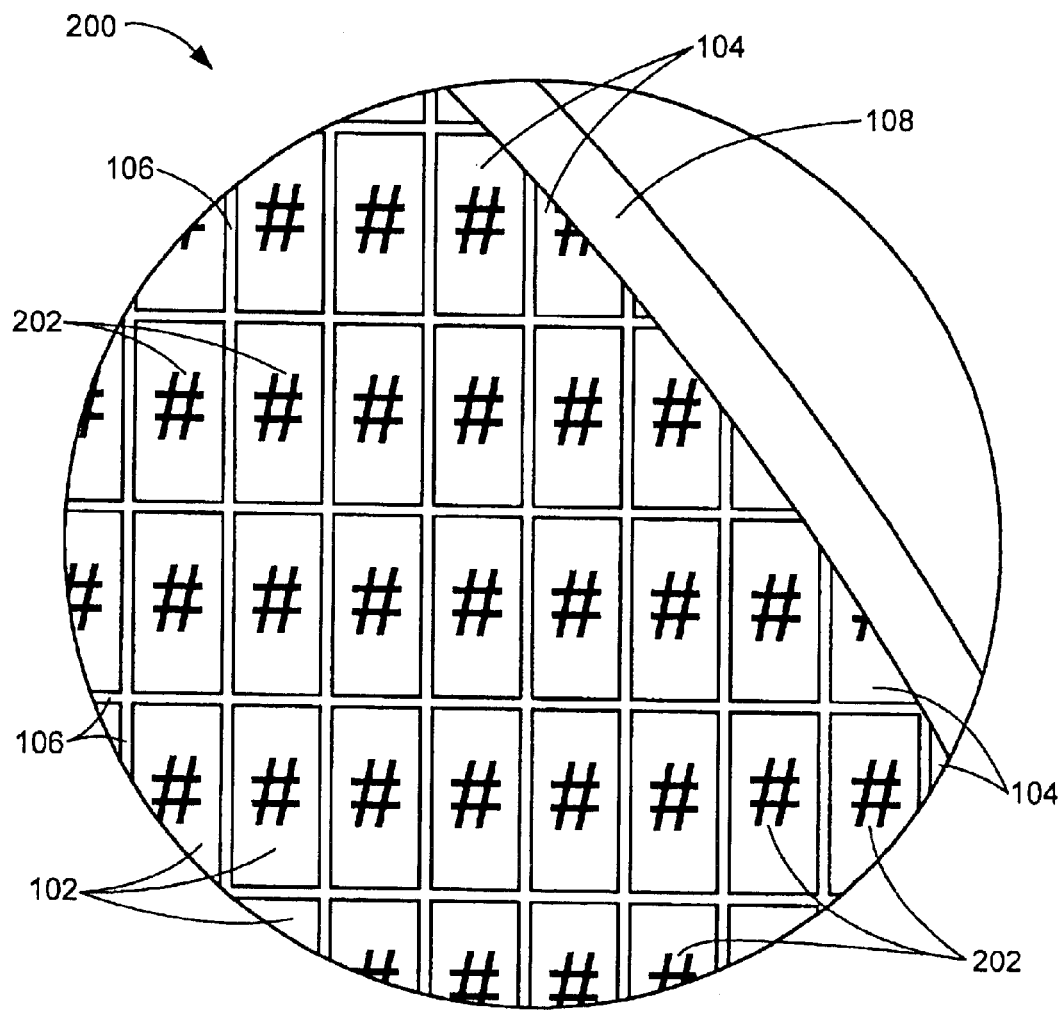
FIG. 2 (PRIOR ART) is an enlarged view of a wafer portion at and near the periphery of a structure similar to FIG. 1.

Referring now to FIG. 2 (PRIOR ART), therein is shown an enlarged view of a wafer portion 200 at and near the periphery of a structure similar to the wafer 100, as indicated generally by circle 2 in FIG. 1. In the conventional manner just described, the complete dies 102 and the partial dies 104 are all provided with the same respective complete and partial circuit patterns 202, represented symbolically by the character "#".

Figure 3:
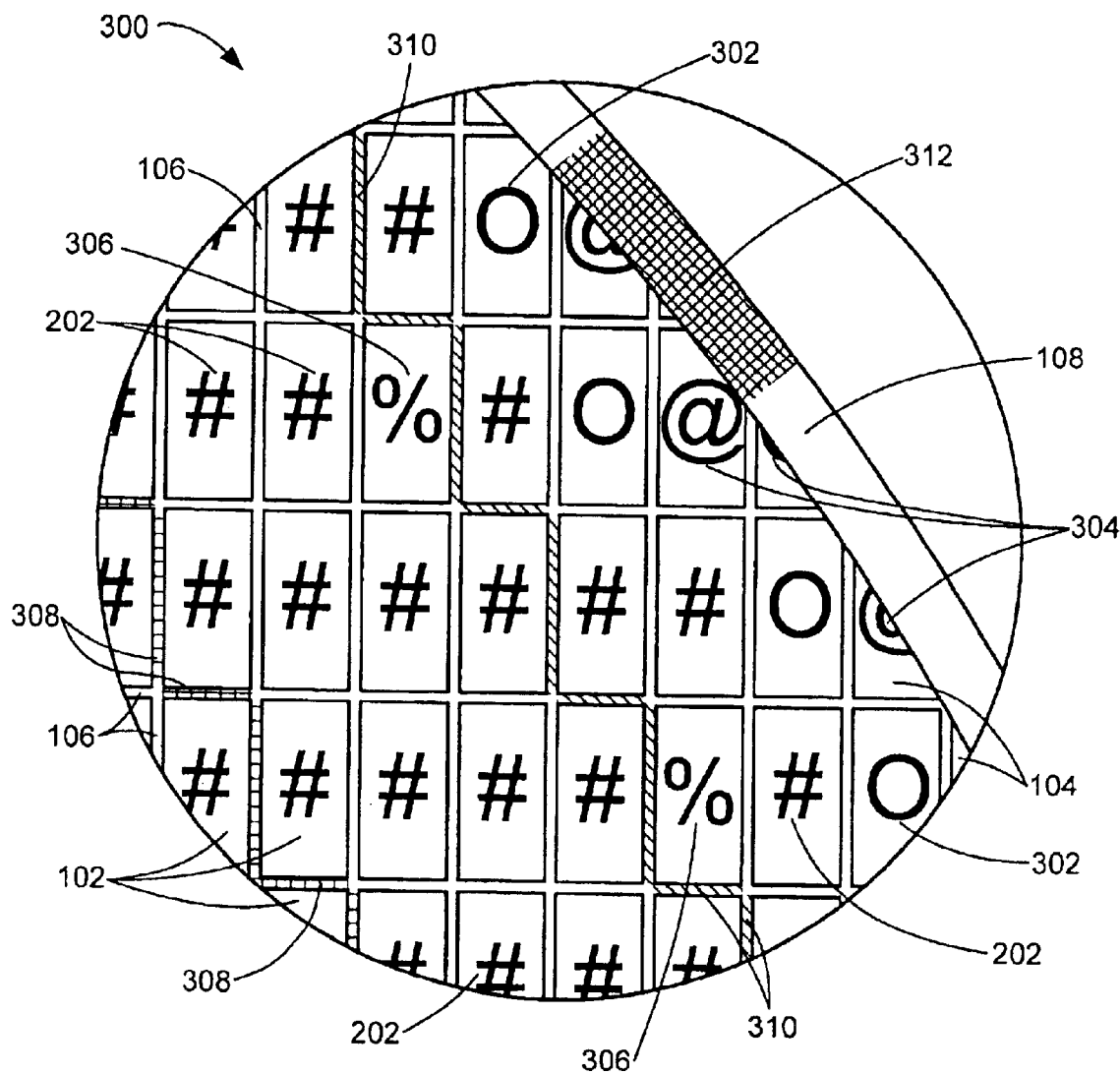
FIG. 3 is an enlarged view of a wafer portion, similar to the structure of FIG. 2 (PRIOR ART), with modulated patterning in accordance with the present invention.

Referring now to FIG. 3, therein is shown an enlarged view, similar to FIG. 2 (PRIOR ART), of a wafer portion 300 that is provided with modulated patterning according to the present invention. Unlike previous techniques, as illustrated in FIG. 2 (PRIOR ART), where the circuit pattern 202 was either omitted from the partial dies 104 or was replicated the same across the entire wafer, the wafer portion 300 uses differing patterns 302, 304, and 306 in selected areas of the wafer. As used herein, the tern "differing pattern" thus refers to a pattern other than no pattern and other than the circuit pattern 202. The differing patterns 302, 304, and 306 produce different thermal absorption profiles, and thereby provide for more finely balancing pattern loading effects through judicious selection of these individual patterns and pattern groupings, as appropriate. This permits more uniform temperatures to be achieved across the wafer, thereby improving process uniformity and eliminating wafer warpage.

For illustrative purposes, the differing patterns 302, 304, and 306 are indicated in FIG. 3 by respective symbols "O", "@", and "%". For example, and not by way of limitation, the differing pattern 302 might be a solid area of silicon oxide (low heat absorption), the differing pattern 306 could be a nearly solid area of unmodified silicon (high heat absorption), and the differing pattern 304 could be formed of a pattern or a material having a net heat absorption in between that of the differing patterns 302 and 306. The choices and degrees of heat absorption, of course, will be chosen according to the needs of the particular wafer at hand. Based on this disclosure, the way of making, choosing, and distributing these differing patterns would be obvious to one of ordinary skill in the art.

Similar tuning of the thermal absorption properties of the wafer may be provided by forming differing patterns as appropriate within the scribe lines 106, as illustrated by scribe line patterns 308 and 310, and in the wafer edge area 108, as illustrated by an edge area pattern 312.

Figure 4:
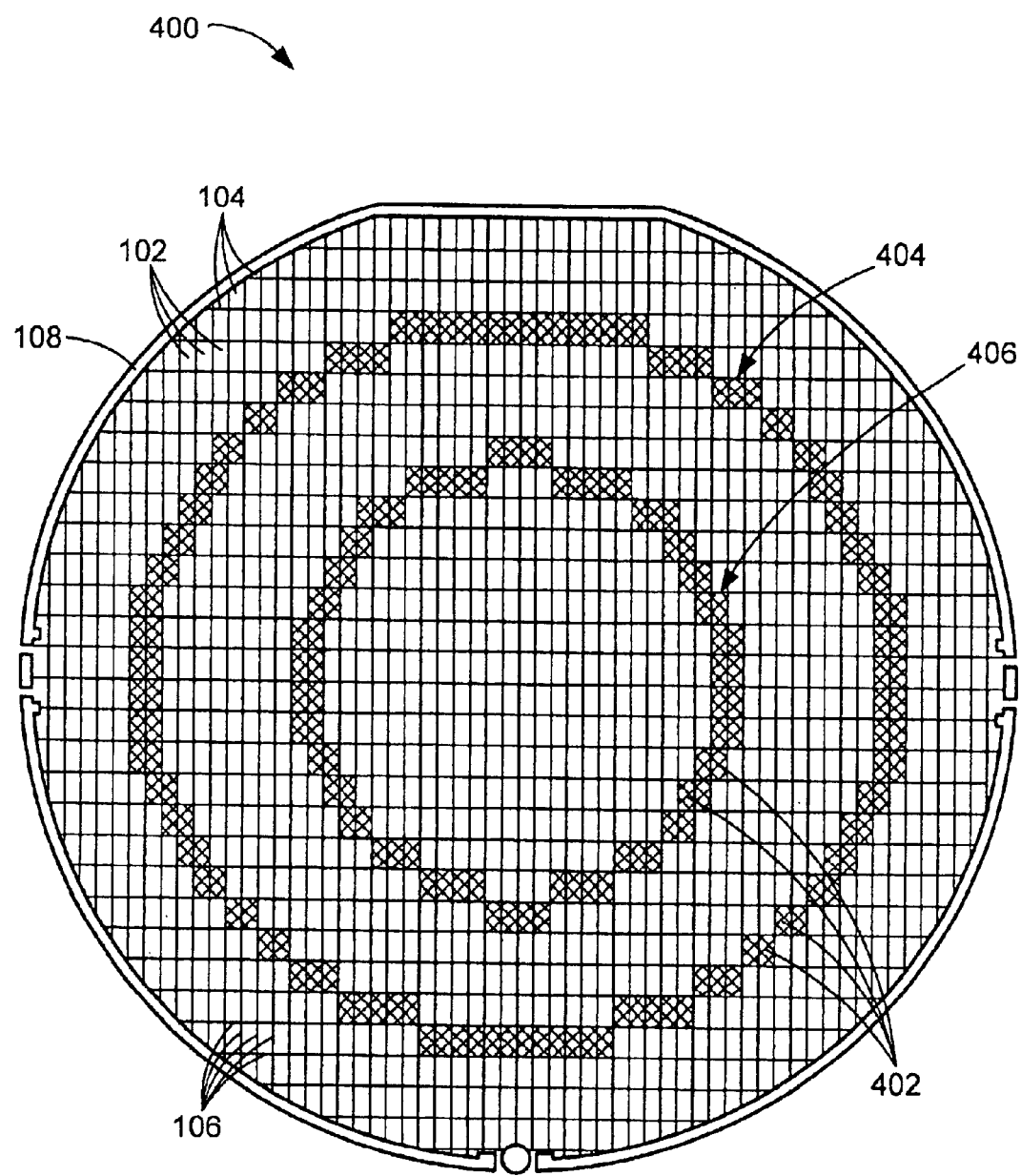
FIG. 4 is a view similar to FIG. 1 of a wafer having in-wafer dummy tiling with differing surface absorption patterns.

Referring now to FIG. 4, therein is shown a wafer 400 in which in-wafer dummy tiling 402 has been provided with differing surface absorption patterns, as taught herein, and arranged in concentric rings 404 and 406 on the wafer 400. The concentric rings 404 and 406 of the in-wafer dummy tiling 402 can be particularly advantageous in symmetrically balancing temperatures from center-to-edge on the wafer 400 and eliminating differences therein.

Figure 5:
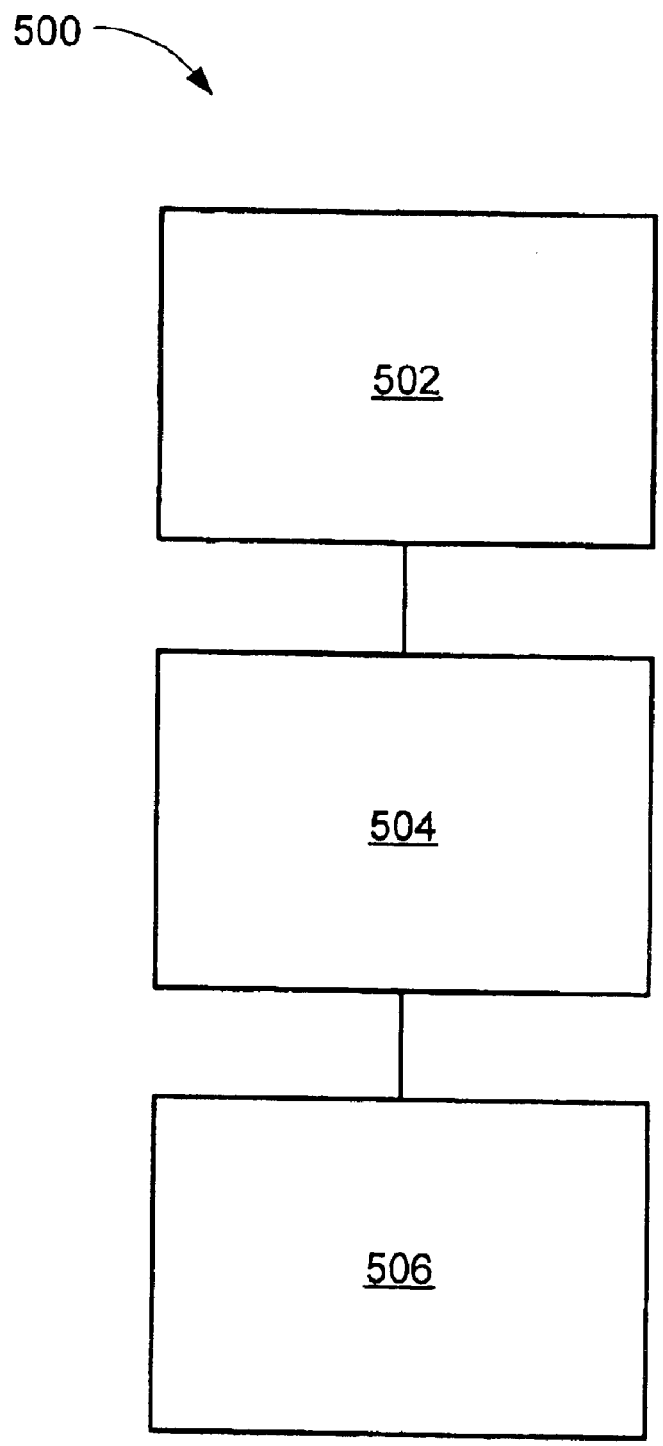
FIG. 5 is a flow chart of a method for manufacturing an integrated circuit by tuning the thermal absorption properties of a wafer in accordance with the present invention.

Referring now to FIG. 5, therein is shown a simplified flow chart of a method 500 for manufacturing an integrated circuit in accordance with the present invention. The method 500 includes: providing a semiconductor wafer having complete die and partial die areas thereon in a step 502; forming functional circuit patterns in a plurality of the complete die areas in a step 504; and tuning the thermal absorption properties of the wafer by forming differing patterns in a plurality of the partial die areas in a step 506.

It has thus been discovered that the present invention has numerous advantages. Principally, it provides for sensitive and precise adjustment of the thermal response of semiconductor wafers by providing modulated patterning useable throughout the wafer. In one embodiment, the modulated patterning is produced by forming differing patterns on selected complete and partial dies throughout the wafer, as appropriate, for tuning the thermal absorption properties of the wafer. The wafer can thus be designed to be more thermally "neutral", and thereby less sensitive to oven variations, resulting in less process tuning, less wafer warpage, and higher product yields.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing an integrated circuit, comprising:
   providing a semiconductor wafer having complete die and partial die areas thereon;
   forming functional circuit patterns in a plurality of the complete die areas; and
   tuning the thermal absorption properties of the semiconductor wafer by forming differing patterns in a plurality of the partial die areas.

2. The method of claim 1 further comprising:
   forming scribe lines between the die areas; and
   forming differing patterns in at least a portion of the scribe lines.

3. The method of claim 1 wherein providing the semiconductor wafer includes providing a wafer edge area on the periphery thereof, and further comprising forming differing patterns in at least a portion of the wafer edge area.

4. The method of claim 1 further comprising forming differing patterns in at least some of the complete die areas.

5. The method of claim 4 wherein the differing patterns in the complete die areas substantially describe at least one concentric ring on the semiconductor wafer.

6. A method for manufacturing an integrated circuit, comprising:
   providing a semiconductor wafer having a plurality of complete die areas thereon, a plurality of partial die areas thereon, and a wafer edge area along the periphery of the semiconductor wafer;
   forming functional circuit patterns in a plurality of the complete die areas;
   forming scribe lines between at least the complete die areas to provide for individually separating complete dies from the semiconductor wafer; and
   tuning the thermal absorption properties of the semiconductor wafer by forming modulated patterning of differing patterns in a plurality of the partial die areas.

7. The method of claim 6 further comprising forming differing patterns in at least portion of the scribe lines.

8. The method of claim 6 further comprising forming differing patterns in at least portion of the wafer edge area.

9. The method of claim 6 further comprising forming differing patterns in at least some of the complete die areas.

10. The method of claim 9 wherein the differing patterns in the complete die areas substantially describe at least one concentric ring on the semiconductor wafer.

11. An integrated circuit, comprising:
    a semiconductor wafer having complete die and partial die areas thereon;
    functional circuit patterns formed in a plurality of the complete die areas; and
    differing patterns formed in a plurality of the partial die areas to tune the thermal absorption properties of the semiconductor wafer.

12. The integrated circuit of claim 11 further comprising:
    scribe lines between the die areas; and
    differing patterns formed in at least a portion of the scribe lines.

13. The integrated circuit of claim 11 wherein the semiconductor wafer includes:
    a wafer edge area on the periphery thereof; and
    differing patterns formed in at least a portion of the wafer edge area.

14. The integrated circuit of claim 11 further comprising differing patterns formed in at least some of the complete die areas.

15. The integrated circuit of claim 14 wherein the differing patterns in the complete die areas substantially describe at least one concentric ring on the semiconductor wafer.

16. An integrated circuit, comprising:
    a semiconductor wafer having a plurality of complete die areas thereon, a plurality of partial die areas thereon, and a wafer edge area along the periphery of the semiconductor wafer;

functional circuit patterns formed in a plurality of the complete die areas;

scribe lines between at least the complete die areas to provide for individually separating complete dies from the semiconductor wafer; and modulated patterning of differing patterns formed in a plurality of the partial die areas to tune the thermal absorption properties of the semiconductor wafer.

17. The integrated circuit of claim 16 further comprising differing patterns formed in at least a portion of the scribe lines.

18. The integrated circuit of claim 16 further comprising differing patterns formed in at least a portion of the wafer edge area.

19. The integrated circuit of claim 16 further comprising differing patterns formed in at least some of the complete die areas.

20. The integrated circuit of claim 19 wherein the differing patterns in the complete die areas substantially describe at least one concentric ring on the semiconductor wafer.

* * * * *